(12) United States Patent
Juan

(10) Patent No.: US 9,119,308 B2
(45) Date of Patent: Aug. 25, 2015

(54) COVER

(71) Applicants: INVENTEC (PUDONG) TECHNOLOGY CORPORATION, Shanghai (CN); INVENTEC CORPORATION, Taipei (CN)

(72) Inventor: Hui-Ping Juan, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 26 days.

(21) Appl. No.: 14/227,946

(22) Filed: Mar. 27, 2014

(65) Prior Publication Data

US 2015/0146370 A1 May 28, 2015

(30) Foreign Application Priority Data

Nov. 22, 2013 (CN) .......................... 2013 1 0597466

(51) Int. Cl.
| | |
|---|---|
| G06F 1/16 | (2006.01) |
| H05K 5/00 | (2006.01) |
| H05K 7/00 | (2006.01) |
| B65D 5/52 | (2006.01) |
| B65D 25/24 | (2006.01) |
| H05K 5/03 | (2006.01) |
| H05K 5/02 | (2006.01) |

(52) U.S. Cl.
CPC ................ *H05K 5/03* (2013.01); *G06F 1/1613* (2013.01); *H05K 5/0217* (2013.01); *H05K 5/0247* (2013.01)

(58) Field of Classification Search
CPC ..... H05K 5/00; H05K 5/0247; H05K 5/0217; G06F 1/18; G06F 1/181; G06F 1/1613; G06F 1/1626

USPC ....................................................... 206/45.23
See application file for complete search history.

(56) References Cited

U.S. PATENT DOCUMENTS

| | | | | |
|---|---|---|---|---|
| 5,752,597 | A * | 5/1998 | Brangle, Jr. ................ | 206/45.21 |
| 8,393,464 | B2 * | 3/2013 | Yang et al. .................... | 206/45.2 |
| 8,544,639 | B2 * | 10/2013 | Yang et al. .................... | 206/45.2 |
| 8,640,864 | B2 * | 2/2014 | Chen et al. .................... | 206/45.2 |
| 8,714,510 | B2 * | 5/2014 | McCosh et al. ............... | 248/460 |
| 8,757,375 | B2 * | 6/2014 | Huang .......................... | 206/320 |
| D708,838 | S * | 7/2014 | Lee ............................... | D3/201 |
| 8,820,695 | B2 * | 9/2014 | Nakada et al. ................ | 248/454 |
| 8,833,819 | B2 * | 9/2014 | Chen ............................... | 294/25 |
| 8,915,357 | B2 * | 12/2014 | Mecchella ................. | 206/45.23 |
| 9,010,529 | B2 * | 4/2015 | Chen et al. .................... | 206/45.2 |
| 9,038,979 | B2 * | 5/2015 | Lu et al. ......................... | 248/371 |
| 2006/0285283 | A1 * | 12/2006 | Simonian et al. ............. | 361/679 |

(Continued)

*Primary Examiner* — Hoa C Nguyen
*Assistant Examiner* — Xanthia C Cunningham
(74) *Attorney, Agent, or Firm* — Huffman Law Group, PC

(57) ABSTRACT

A cover for an electronic device includes a bottom plate, a first support plate, a top plate, two bending plates and a rubber trim. The bottom plate has a first end and a second end that are opposite to each other. The first support plate is connected to the first end of the bottom plate. The top plate is connected to the second end of the bottom plate, for expanding or closing relative to the bottom plate, and the top plate having a through hole. The two bending plates are opposite to each other and connect the bottom plate and the top plate. The two bending plates, the bottom plate and the top plate form an accommodating space. The rubber trim is disposed on the first support plate. When the top plate closes relative to the bottom plate, the top plate pass through and protrudes from the through hole.

8 Claims, 5 Drawing Sheets

(56) References Cited

U.S. PATENT DOCUMENTS

| | | | |
|---|---|---|---|
| 2009/0009945 A1* | 1/2009 | Johnson et al. | 361/681 |
| 2009/0272670 A1* | 11/2009 | Petrelli et al. | 206/736 |
| 2012/0181195 A1* | 7/2012 | Lu et al. | 206/320 |
| 2012/0248277 A1* | 10/2012 | Yang et al. | 248/346.3 |
| 2013/0043148 A1* | 2/2013 | Chen et al. | 206/45.23 |
| 2013/0146482 A1* | 6/2013 | Huang | 206/45.23 |
| 2013/0258586 A1* | 10/2013 | Shao et al. | 361/679.55 |
| 2013/0284615 A1* | 10/2013 | Lee | 206/45.23 |
| 2013/0284866 A1* | 10/2013 | Lee | 248/188.6 |
| 2014/0029197 A1* | 1/2014 | Hishinuma | 361/679.55 |

\* cited by examiner

COVER

CROSS-REFERENCE TO RELATED APPLICATIONS

This non-provisional application claims priority under 35 U.S.C. §119(a) on Patent Application No(s). 201310597466.X filed in China, P.R.C. on 2013 Nov., 22, the entire contents of which are hereby incorporated by reference.

BACKGROUND OF THE INVENTION

1. Technical Field of the Invention

The disclosure relates to a cover, more particularly to a cover with a speaker.

2. Description of the Related Art

Nowadays consumers have a high standard for computer's portability. For satisfying these consumers, the related industries develop tablet computers, which are small and easy to carry. Different from the traditional laptops, the tablet computer has a touch screen which allows users to operate by touching it, and most tablet computers allow users to write on the touch screen and zoom in/out on the touch screen.

The users often purchase a cover for the tablet because it can buffer the shocks on the tablet computer, thereby avoiding the structural damage thereof. Moreover, the cover can be used as a stand for the tablet computer so that the tablet computer can be erected on the cover and lean on it. However, the audio performance is an important characteristic of the tablet computer while today's cover contributes nothing to the audio performance. Thus, it is important to develop a cover which can improve the audio performance of the tablet computer.

SUMMARY OF THE INVENTION

A cover configured for an electronic device comprises a bottom plate, a first support plate, a top plate, two bending plates and a rubber trim. The bottom plate has a first end and a second end that are opposite to each other. The first support plate is connected to the first end of the bottom plate. The top plate is connected to the second end of the bottom plate, for expanding or closing relative to the bottom plate, and the top plate having a through hole. The two bending plates are opposite to each other and connect the bottom plate and the top plate. The two bending plates, the bottom plate and the top plate form an accommodating space configured for accommodating the electronic device. The rubber trim is disposed on the first support plate. When the top plate closes relative to the bottom plate, the top plate pass through and protrudes from the through hole.

BRIEF DESCRIPTION OF THE DRAWINGS

The present disclosure will become more fully understood from the detailed description given hereinbelow, along with the accompanying drawings which are for illustration only, thus are not limitative of the present disclosure, and wherein.

DETAILED DESCRIPTION

Figure 1:
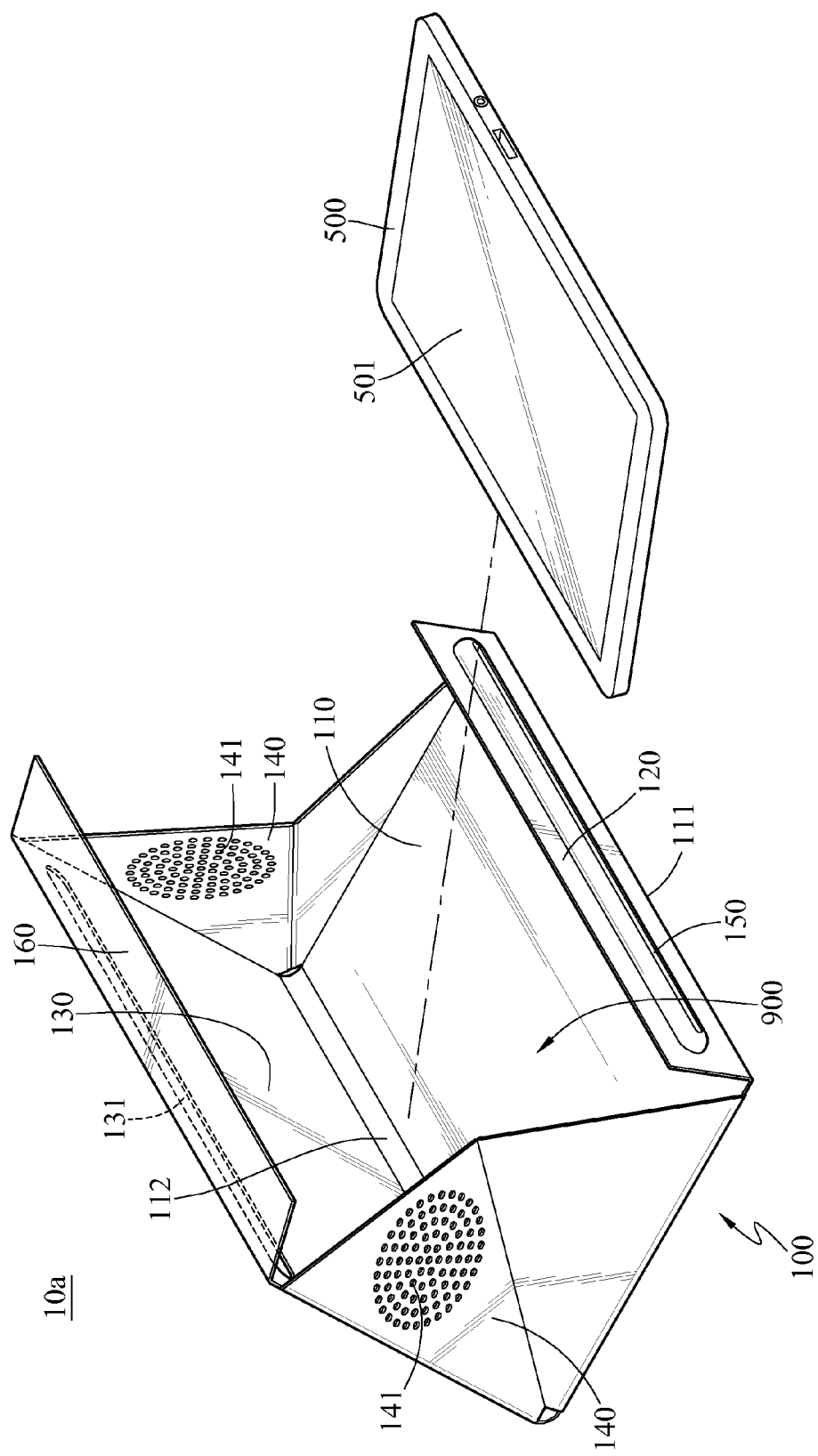
FIG. 1 is an exploded view of an electronic device and a cover according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
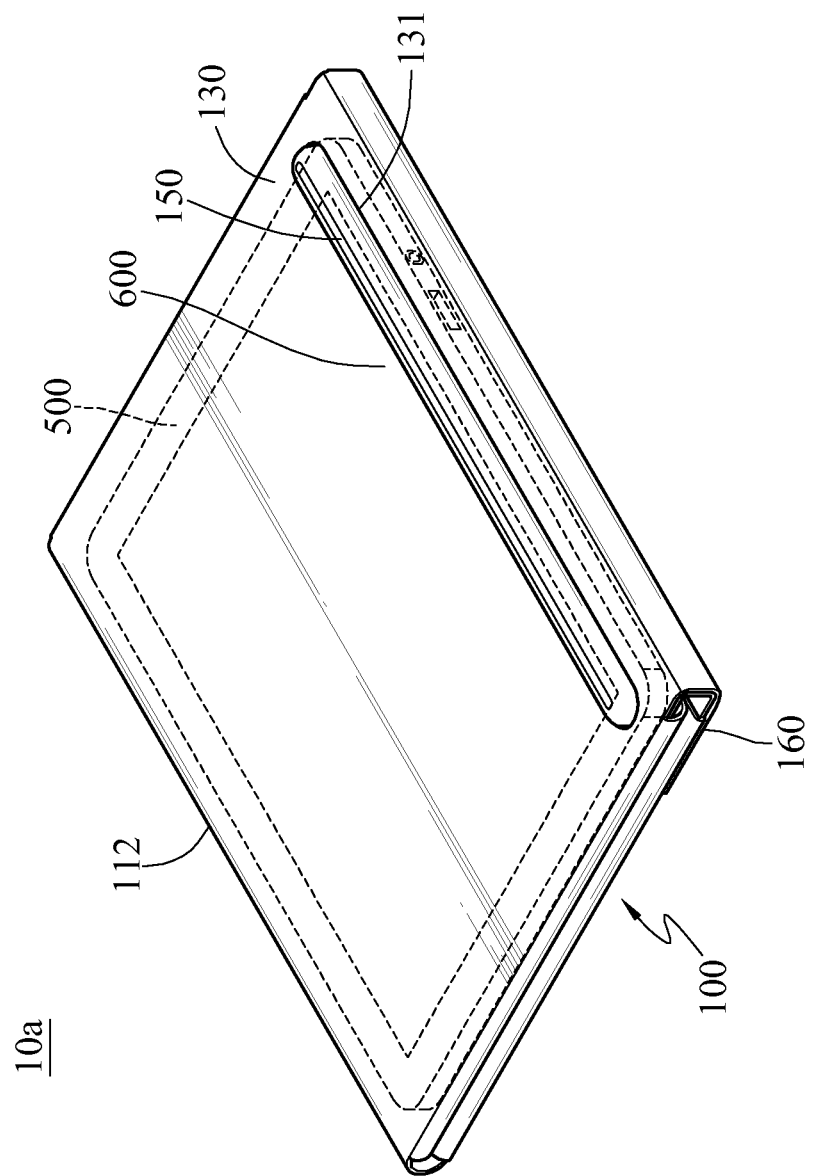
FIG. 2 is a perspective view of the electronic device and the closed cover according to one embodiment of the disclosure.
Figure 3:
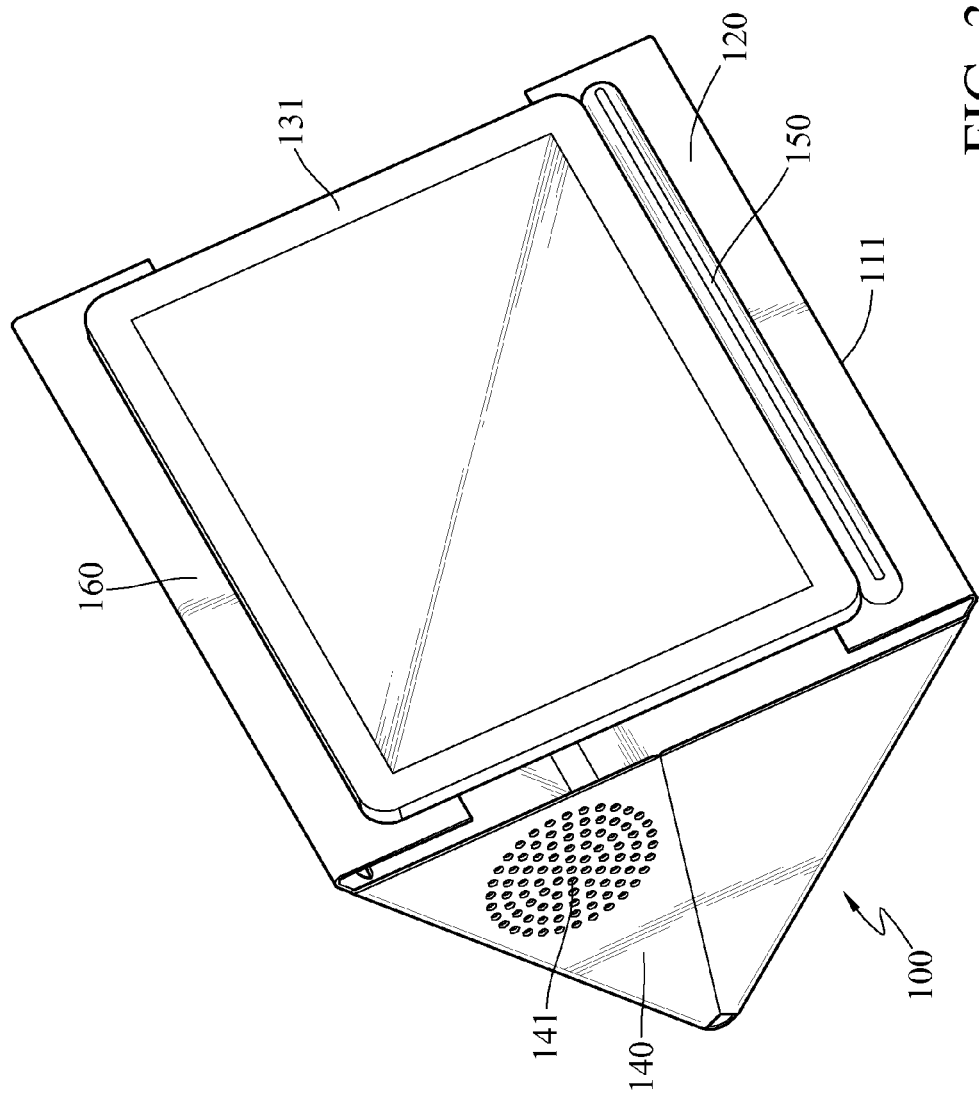
FIG. 3 is a perspective view of the electronic device and the expanded cover according to one embodiment of the disclosure.

FIG. 1 is an exploded view of an electronic device and a cover according to one embodiment of the disclosure; FIG. 2 is a perspective view of the electronic device and the closed cover according to one embodiment of the disclosure; and FIG. 3 is a perspective view of the electronic device and the expanded cover according to one embodiment of the disclosure. As seen in FIG. 1 to FIG. 3, a cover 10a configured for an electronic device 500 is provided. In this embodiment, the electronic device 500 is a tablet computer, but it is not limited thereto. In this embodiment, one side of the electronic device 500, away from the monitor 501, has a built-in speaker (not shown in the figures).

The cover 10a comprises the cover body 100. The cover body 100 comprises a bottom plate 110, a first support plate 120, a top plate 130, two bending plates 140 opposite to each other, a rubber trim 150 and a second support plate 160.

The bottom plate 110 has a first end 111 and a second end 112 opposite to each other. The first support plate 120 is connected to the first end 111 of the bottom plate 110; the rubber trim 150 is disposed on the second support plate 160.

The top plate 130 is connected to the second end 112 of the bottom plate 110 while the top plate 130 can expand or close relative to the bottom plate 110.

The two bending plates 140 connect the bottom plate 110 and the top plate 130. The two bending plates 140, the bottom plate 110 and the top plate 130 form a accommodation space 900, and the accommodation space 900 can be used for accommodating the electronic device 500. In this embodiment, the two bending plates 140 respectively have a sound hole 141. In other embodiments, however, the total number of the sound hole 141 may be one.

The second support plate 160 is connected to one side of the top plate 130 away from the second end 112, while the second support plate 160 can expand or close relative to the top plate 130. In this embodiment, the materials of the bottom plate 110, the top plate 130, the bending plates 140, the first support plate 120, and the second support plate 160 are leather, but they are not limited thereto.

The usage of the cover 10a will be illustrated below. As seen in FIG. 2 and FIG. 3, when the user do not need to use the electronic device 500, the electronic device 500 can be stored in the accommodation space 900 and the cover 10a can be closed. During the closure of the cover 10a, the bending plates 140 are bent towards the accommodation space 900, the top plate 130 is pivoted relative to the cover body 100 for closing, the first support plate 120 is closed and is attached to one side of the bottom plate 110, while the second support plate 160 is closed and is attached to another side of the bottom plate 110. Additionally, in this embodiment, the top plate 130 has a through hole 131. When the cover 10a is closed, the rubber trim 150 pass through and protrudes from the through hole 131. As a result, since the rubber trim 150 has greater friction, the user can grasp the rubber trim 150 conveniently when the cover 10a is closed, thereby improving the feeling and stability (e.g. the cover 10a does not slip out of user's hand) in terms of grabbing the cover 10a.

The cover 10a can be expanded when the user needs to erect the electronic device 500. Specifically, the top plate 130 is pivoted relative to the bottom plate 110 for expanding. The first support plate 120 is pivoted relative to the bottom plate 110 for expanding, the second support plate 160 is pivoted relative to the top plate 130 for expanding, and the top plate 130 and the second support plate 160 are coplanar. Thereby, the user can place the electronic device 500 on the rubber trim 150, and the electronic device 500 leans on the second support plate 160 and the first support plate 120. Since the electronic device 500 covers the accommodation space 900 of the cover body 100, the accommodation space 900 becomes a closed space. When music or sound comes out from the built-in speaker of the electronic device 500, this closed space can be an amplifier (namely, speaker box), thereby improving the audio performance.

Figure 4:
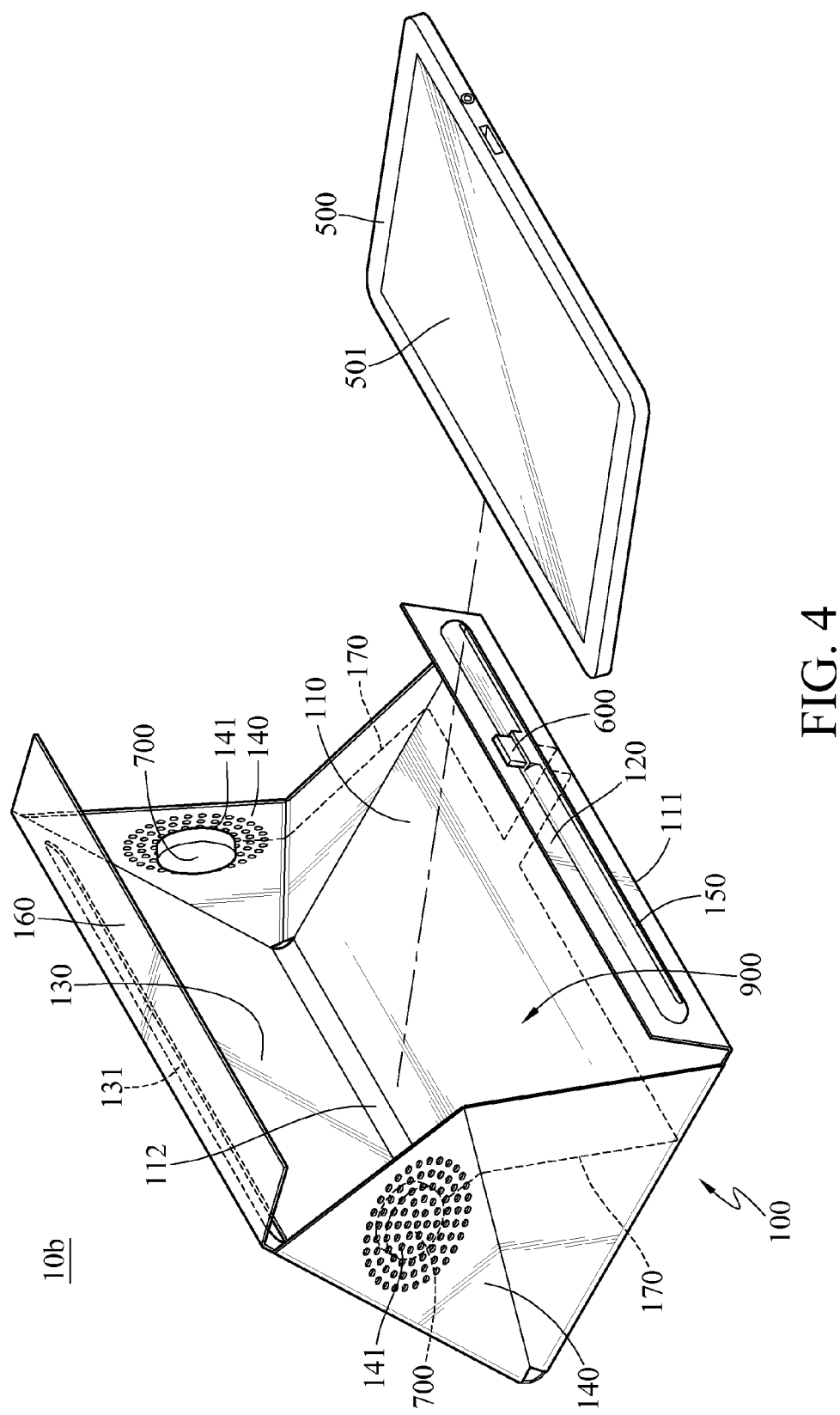
FIG. 4 is an exploded view of an electronic device and an expanded cover according to another embodiment of the disclosure.

FIG. 4 is a perspective view of an electronic device and an expanded cover according to another embodiment of the disclosure. The cover 10b of this embodiment is similar to the cover 10a and only the differences between them are explained herein. As seen in FIG. 4, the cover 10b further comprises a connector 600, a connecting line 170 and two speaker modules 700. In other embodiments, the number of the speaker module 700 may be one, or greater than or equal to three. In this embodiment, the connector 600 is Universal Serial Bus (USB), but it is not limited thereto. In this embodiment, the speaker module 700 is a thin speaker but it is not limited thereto.

The connector 600 and the rubber trim 150 are disposed on the second support plate 160, while the connector 600 protrudes from the rubber trim 150. The connector 600 is configured for being electrically connected to the electronic device 500. When the cover 10b has a built-in battery, it can charge the electronic device 500 via the connector 600.

The two speaker modules 700 are disposed on the two bending plates 140, respectively. In this embodiment, the speaker module 700 are on the inner wall of the bending plates 140 and near the sound hole 141, while the connecting line 170 electrically connects the two speaker modules 700 and the connector 600. Moreover, in this embodiment, the connecting line 170 is buried (namely, embedded) in each plate (e.g. the bending plates 140 and the bottom plate 110) of the cover body 100. As a result, the user does not see the connecting line 170 and the connector 600, so the appearance of the cover 10b is clean and tidy. In other embodiments, the speaker module 700 may be located on the inner wall of the bottom plate 110 and the top plate 130.

The cover 10b can be expanded when the user need to erect the electronic device 500. Specifically, the top plate 130 is pivoted relative to the bottom plate 110 for expanding. The first support plate 120 is pivoted relative to the bottom plate 110 for expanding, the second support plate 160 is pivoted relative to the top plate 130 for expanding, and the top plate 130 and the second support plate 160 are coplanar. Thereby, the user can place the electronic device 500 on the rubber trim 150. Additionally, the electronic device 500 leans on the second support plate 160 and the first support plate 120 and is electrically connected to the connector 600. Since the speaker module 700, the connector 600 and the electronic device 500 are electrically connected to each other, music or sound from the electronic device 500 can be played by the speaker module 700 which has better audio quality than the electronic device 500. Furthermore, since the electronic device 500 covers the accommodation space 900 of the cover body 100, the accommodation space 900 becomes a closed space. When music or sound comes out from the built-in speaker of the electronic device 500, this closed space can be an amplifier, thereby improving the audio performance.

Figure 5:
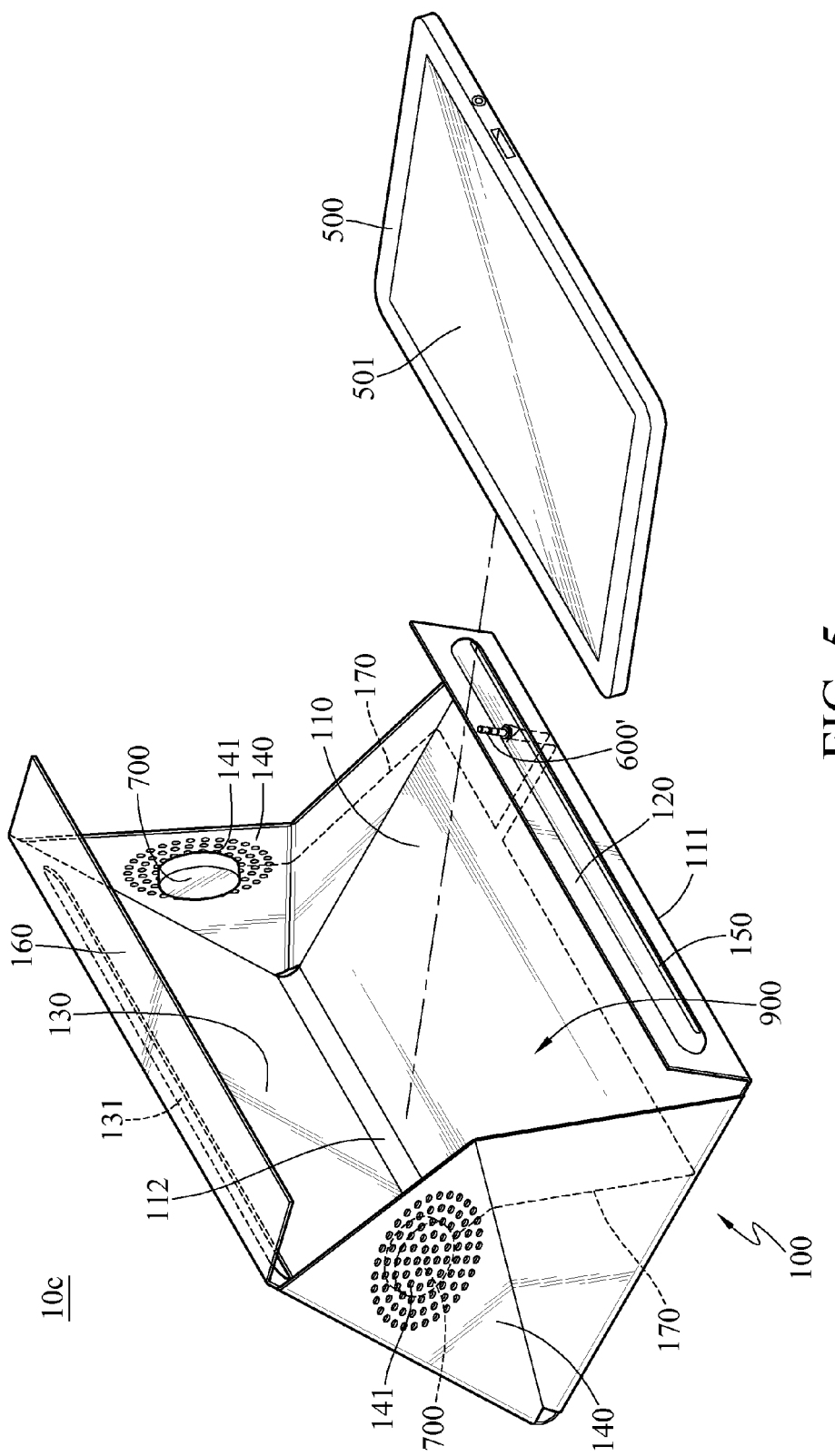
FIG. 5 is an exploded view of an electronic device and an expanded cover according to still another embodiment of the disclosure.

FIG. 5 is a perspective view of an electronic device and an expanded cover according to still another embodiment of the disclosure. As seen in FIG. 5, the cover 10c is similar to the cover 10b illustrated in the previous embodiment, but the connector 600' of the cover 10c is a 3.5 mm audio connector instead.

To sum up, an amplifier can be formed when the electronic device is erected on the expanded cover so that the audio performance of the electronic device is improved.

What is claimed is:

1. A cover configured for an electronic device and comprising:
    a bottom plate having a first end and a second end that are opposite to each other;
    a first support plate connected to the first end of the bottom plate;
    a top plate connected to the second end of the bottom plate, for expanding or closing relative to the bottom plate, and the top plate having a through hole;
    two bending plates opposite to each other and connecting the bottom plate and the to plate, wherein the two bending plates, the bottom plate and the top plate form an accommodating space configured for accommodating the electronic device;
    a connector and at least one speaker module, wherein the connector is disposed on the first support plate and is configured for being electrically connected to the electronic device, the at least one speaker module is disposed on the bottom plate, the top plate or the two bending plate and is electrically connected to the connector; and
    a rubber trim disposed on the first support plate, wherein when the top plate closes relative to the bottom plate, the top plate passes through and protrudes from the through hole.

2. The cover according to claim 1, further comprising a connecting line electrically connecting the at least one speaker module and the connector.

3. The cover according to claim 1, wherein the at least one speaker module is a thin speaker.

4. The cover according to claim 1, wherein the connector is Universal Serial Bus (USB).

5. The cover according to claim 1, wherein the connector is a 3.5 mm audio connector.

6. A cover configured for an electronic device and comprising:
    a bottom plate having a first end and a second end that are opposite to each other;
    a first support plate connected to the first end of the bottom plate;
    a top plate connected to the second end of the bottom plate, for expanding or closing relative to the bottom plate, and the top plate having a through hole;
    a second support plate connected to a side of the top plate, away from the second end, for expanding or closing relative to the top plate;
    two bending plates opposite to each other and connecting the bottom plate and the to plate, wherein the two bending plates, the bottom plate and the top plate form an accommodating space configured for accommodating the electronic device; and a rubber trim disposed on the first support plate, wherein when the top plate closes relative to the bottom plate, the top plate passes through and protrudes from the through hole;

wherein when the top plate expands relative to the bottom plate, the electronic device is configured for being placed on the rubber trim and electrically connected to the connector while leans on the second support plate and the first support plate.

7. The cover according to claim 6, wherein the electronic device is a tablet computer.

8. A cover configured for an electronic device and comprising:

a bottom plate having a first end and a second end that are opposite to each other;

a first support plate connected to the first end of the bottom plate;

a top plate connected to the second end of the bottom plate, for expanding or closing relative to the bottom plate, and the top plate having a through hole;

two bending plates opposite to each other and connecting the bottom plate and the to plate, wherein the two bending plates, the bottom plate and the top plate form an accommodating space configured for accommodating the electronic device; and a rubber trim disposed on the first support plate, wherein when the top plate closes relative to the bottom plate, the top plate passes through and protrudes from the through hole;

wherein the two bending plates.

* * * * *

UNITED STATES PATENT AND TRADEMARK OFFICE
CERTIFICATE OF CORRECTION

PATENT NO. : 9,119,308 B2  
APPLICATION NO. : 14/227946  
DATED : August 25, 2015  
INVENTOR(S) : Hui-Ping Juan Page 1 of 1

It is certified that error appears in the above-identified patent and that said Letters Patent is hereby corrected as shown below:

Title Page, Item (71) should read

(71) Applicants: INVENTEC (PUDONG) TECHNOLOGY CORPORATION, Shanghai (CN); INVENTEC CORPORATION, Taipei (TW)

Signed and Sealed this  
Twelfth Day of July, 2016

Michelle K. Lee  
*Director of the United States Patent and Trademark Office*